United States Patent
Asbeck et al.

(10) Patent No.: US 8,159,295 B2
(45) Date of Patent: Apr. 17, 2012

(54) SUPPLY-MODULATED RF POWER AMPLIFIER AND RF AMPLIFICATION METHODS

(75) Inventors: Peter M. Asbeck, Del Mar, CA (US); Donald Kimball, San Diego, CA (US); Jinseong Jeong, Plano, TX (US)

(73) Assignee: The Regents of the University of California, Oakland, CA (US)

( * ) Notice: Subject to any disclaimer, the term of this patent is extended or adjusted under 35 U.S.C. 154(b) by 19 days.

(21) Appl. No.: 12/785,090

(22) Filed: May 21, 2010

(65) Prior Publication Data

US 2010/0295613 A1 Nov. 25, 2010

Related U.S. Application Data

(60) Provisional application No. 61/180,229, filed on May 21, 2009.

(51) Int. Cl.
*H03G 3/20* (2006.01)
*H03F 3/04* (2006.01)

(52) U.S. Cl. .................................. 330/136; 330/297
(58) Field of Classification Search .............. 330/127, 330/137, 297
See application file for complete search history.

(56) References Cited

U.S. PATENT DOCUMENTS

| | | | |
|---|---|---|---|
| 6,583,664 B2 | 6/2003 | Mathe et al. | |
| 7,881,683 B2 * | 2/2011 | Hellberg et al. | 455/127.1 |
| 2009/0004981 A1 | 1/2009 | Eliezer et al. | |

OTHER PUBLICATIONS

Raab et al, "Power amplifiers and transmitters for RF and microwave," *IEEE Trans. Microw. Theory Tech.*, vol. 50, pp. 814-826, Mar. 2002.

Draxler et al., "High efficiency envelope tracking LDMOS power amplifier for W-CDMA," in *Proc. IEEE MTT-S Int. Microw. Symp.*, San Francisco, CA, pp. 1534-1537, Jun. 2006.

(Continued)

*Primary Examiner* — Robert Pascal
*Assistant Examiner* — Khiem Nguyen
(74) *Attorney, Agent, or Firm* — Greer, Burns & Crain Ltd.

(57) ABSTRACT

An embodiment of the invention is a method of generating a reduced bandwidth envelope signal $V_{DD}(t)$ for the power supply modulator of an RF amplifier. An envelope signal of an RF amplifier input $V_{env}(t)$ is low pass filtered. The filtered envelope signal is subtracted from the envelope signal to obtain a difference signal, which is rectified to produce a residue signal. The residue signal is low pass filtered and added back into the filtered envelope signal. An iterative process of the rectifying, low pass filtering the residue signal adding it back is continued until a condition of $V_{DD}(t) \geq V_{env}(t)$ is met. Another embodiment provides a method of generating a reduced bandwidth envelope signal $V_{DD}(t)$ for the power supply modulator of an RF amplifier. An envelope signal of an RF amplifier input $V_{env}(t)$ is low pass filtered. The filtered envelope signal is subtracted from the envelope signal to obtain a difference signal, which is rectified to produce a residue signal. The residue signal is low pass filtered and multiplied by a first constant that is greater than one, and then added back into the filtered envelope signal. A second constant is added into the filtered envelope signal so that the condition $V_{DD}(t) \geq V_{env}(t)$ is met.

8 Claims, 9 Drawing Sheets

OTHER PUBLICATIONS

Kimball et al., "50% PAE WCDMA basestation amplifier implemented with GaN HFET," in *Proc. IEEE Compound Semicond. Integr. Circuit Symp.*, Palm Springs, pp. 89-92. Oct. 2005.

Kimball et al., "High-efficiency envelope-tracking W-CDMA basestation amplifier using GaN HFETs," *IEEE Trans. Microw. Theory Tech.*, vol. 54, pp. 3848-3856, Nov. 2006.

Kimball et al., "High efficiency WCDMA envelope tracking basestation amplifier implemented with GaAs HVHBTs," in *Proc. IEEE Compound Semicond. Integr. Circuit Symp.*, Monterey, CA, Oct. 2008.

Leonard R. Kahn, "Single-sideband transmission by envelope elimination and restoration," *Proc. IRE*, vol. 40, pp. 803-806, Jul. 1952.

Raab et al., "L-Band Transmitter Using Kahn EER Technique," *IEEE Trans. Microw. Theory Tech.*, vol. 46, pp. 2220-2225, Dec. 1998.

Staudinger et al., "High Efficiency CDMA RF Power Amplifier Using Dynamic Envelope Tracking Technique," in *Proc. IEEE MTT-S Int. Microw. Symp.*, Boston, MA, pp. 873-976, Jun. 2000.

Sahu et al., "A High-Efficiency Linear RF Power Amplifier With a Power-Tracking Dynamically Adaptive Buck-Boost Supply," *IEEE Trans. Microw. Theory Tech.*, vol. 52, pp. 112-120, Jan. 2004.

Khanifar et al., "Enhancement of Power Amplifier Efficiency Through Dynamic Bias Switching," in *Proc. IEEE MTT-S Int. Microw. Symp.*, Fort Worth, TX, pp. 2047-2050, Jun. 2004.

Jeong et al., "Wideband Envelope Tracking Power Amplifier with Reduced Bandwidth Power Supply Waveform," in Proc. *IEEE MTT-S Int. Microw. Symp.*, Boston, MA, pp. 1381-1384, Jun. 2009.

Sappal, et al., "Digital Pre-distortion of Power Amplifiers using look-Up Table Method with Memory Effects," *ICGST-PCDC*, vol. 8, issue 1, pp. 39-44, Dec. 2008.

* cited by examiner

SUPPLY-MODULATED RF POWER AMPLIFIER AND RF AMPLIFICATION METHODS

PRIORITY CLAIM AND REFERENCE TO RELATED APPLICATION

The application claims-priority under 35 U.S.C. §119 from prior provisional application Ser. No. 61/180,229, which was filed May 21, 2009.

FIELD

Fields of the invention include radio frequency (RF) power amplifiers and RF power amplifiers for wideband wireless communication systems. Example applications of the invention include wideband wireless communications, networks and wireless wide area network equipment, e.g., cellular network base stations. Specific applications include code division multiple access (CDMA, WCDMA) and orthogonal frequency multiple access (OFDM) systems such as WiMAX and LTE.

BACKGROUND

Modern wideband (broadband) wireless communication systems use a broadband link that is established in a spectrally efficient way by employing linear modulation schemes as QPSK, OQPSK and OFDM. The design of power amplifiers in the RF transmitters is challenging because the goal is to amplify a modulated RF signal with high peak-to-average while using minimum DC power consumption. Class AB amplifiers traditionally used for RF amplification are poorly suited to meet these goals.

A number of newer amplifiers, e.g., envelope tracking (ET) or envelope elimination and restoration (EER) power amplifiers can operate more efficiently in wideband communication systems. However, as the bandwidth of the communication signals becomes broader, the design of the supply modulator becomes the design bottleneck in such supply-modulated RF power amplifiers. The power supply modulator has therefore constrained the design of power supply modulated RF power amplifiers such as the ET, EER, wideband ET amplifiers, and average power ET step ET, also called high accuracy tracking (HAT) amplifiers.

United States published application 20090004981 discloses a method of improving the power efficiency of a digital transmitter for non-constant-amplitude modulation schemes. A bandwidth reduction provides slow form (i.e. reduced bandwidth) of envelope tracking (based on a narrower bandwidth distorted version of the envelope waveform) such that the switching regulator can use a lower switching rate. Pre-distortion of the RF input signal is used to compensate and in one embodiment a look up table is used to provide input amplitude and supply voltage indexed data to provide information for calculating the necessary pre-distortion, but calculation of look up table entries and maintenance of the same is not considered. Bandwidth reduction steps are accomplished based on a peak detector function that detects the local maxima points in the envelope signal and then provides smoothed waveform based upon the detected peaks.

SUMMARY OF THE INVENTION

An embodiment of the invention is a method of generating a reduced bandwidth envelope signal $V_{DD}(t)$ for the power supply modulator of an RF amplifier. An envelope signal of an RF amplifier input $V_{env}(t)$ is low pass filtered. The filtered envelope signal is subtracted from the envelope signal to obtain a difference signal, which is rectified to produce a residue signal. The residue signal is low pass filtered and added back into the filtered envelope signal. An iterative process of the rectifying, low pass filtering the residue signal, and adding it back is continued until a condition of $V_{DD}(t) \geq V_{env}(t)$ is met.

Another embodiment provides a method of generating a reduced bandwidth envelope signal $V_{DD}(t)$ for the power supply modulator of an RF amplifier. An envelope signal of an RF amplifier input $V_{env}(t)$ is low pass filtered. The filtered envelope signal is subtracted from the envelope signal to obtain a difference signal, which is rectified to produce a residue signal. The residue signal is low pass filtered and multiplied by a first constant that is greater than one, and then added back into the filtered envelope signal. A second constant is added into the filtered envelope signal so that the condition $V_{DD}(t) \geq V_{env}(t)$ is met.

DETAILED DESCRIPTION OF THE PREFERRED EMBODIMENTS

Figure 1:
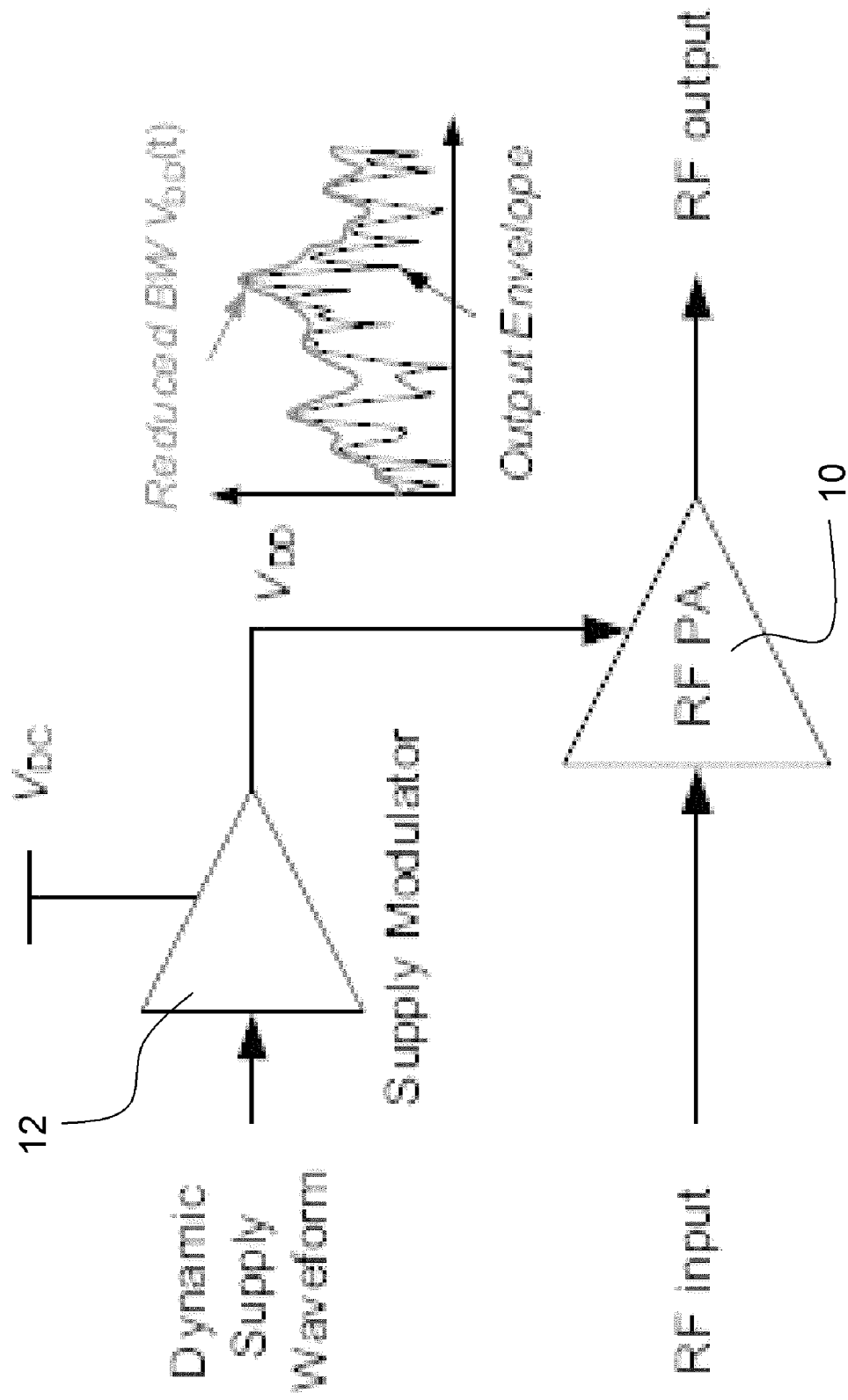
FIG. 1 is a schematic diagram that illustrates an envelope amplifier where power to an RF power amplifier is provided by a power supply modulator.

An embodiment of the invention is a method of generating a reduced bandwidth envelope signal $V_{DD}(t)$ for the power supply modulator of an RF amplifier. An envelope signal of an RF amplifier input $V_{env}(t)$ is low pass filtered. The filtered envelope signal is subtracted from the envelope signal to obtain a difference signal, which is rectified to produce a residue signal. The residue signal is low pass filtered and added back into the filtered envelope signal. An iterative process of the rectifying, low pass filtering the residue signal, and adding it back is continued until a condition of $V_{DD}(t) \geq V_{env}(t)$ is met.

Another embodiment provides a method of generating a reduced bandwidth envelope signal $V_{DD}(t)$ for the power supply modulator of an RF amplifier. An envelope signal of an RF amplifier input $V_{env}(t)$ is low pass filtered. The filtered envelope signal is subtracted from the envelope signal to obtain a difference signal, which is rectified to produce a residue signal. The residue signal is low pass filtered and multiplied by a first constant that is greater than one, and then added back into the filtered envelope signal. A second constant is added into the filtered envelope signal so that the condition $V_{DD}(t) \geq V_{env}(t)$ is met.

Embodiments of the invention provide power supply modulated RF amplifiers and amplification methods utilizing power supply waveforms that are slowly varying, reduced bandwidth signals, but provide high overall power amplifier efficiency. High efficiency is maintained because the reduced bandwidth power supply waveform improves the efficiency of the supply modulator even though it degrades the efficiency of the RF stage. Distortion caused by the bandwidth reduction in the power supply waveform can be compensated by adaptive pre-distortion of the RF input signal. The choice of power supply waveform is constrained by two conditions: 1) the voltage must be sufficiently large to not cause clipping of the amplifier output; and 2) it must be delivered with sufficient accuracy such that the error it introduces can be compensated by adjustment of the RF input signal.

Preferred methods of the invention recognize that the power supply signal in an envelope tracking or similar power supply modulated RF amplifier does not need to be an exact replica of the envelope of original signal. Instead, contrary to conventional approaches, the power supply signal can be a slowly varying, reduced bandwidth signal. Despite that, methods of the invention maintain a high efficiency (although not as high as with an ideal full bandwidth envelope signal.) The choice of power supply waveform is constrained by the two considerations identified above. With methods of the invention, the dynamic power supply waveform can be dramatically reduced in bandwidth and PAPR over what is employed in conventional supply modulated RF amplifiers, simplifying the design of envelope amplifiers. The reduced bandwidth power supply signal introduces a distortion into the RF output, but methods of the invention compensate for this distortion with a calculated pre-distortion of the RF input signal. One cost of methods of the invention is that the bandwidth of the RF input signal is increased over what is employed by typical conventional methods. However, the expanded signal bandwidth can remain within the system limits established by DAC, ADC and filters in the DSP and up conversion systems. As such components advance then such system limits will impose fewer constraints.

RF amplification methods and RF amplifiers of the invention provide relaxed design requirements of the supply modulator. Methods and amplifiers of the invention can improve the efficiency and linearity of the supply modulator for wideband applications. Methods and amplifiers of the invention can also provide designers with flexible trade-offs between the supply modulator and the RF power amplifier in terms of the efficiency, linearity and bandwidth.

An example preferred embodiment of the invention is a modified envelope tracking (ET) amplifier. A modified ET amplified of the invention uses an envelope tracking power supply signal that is different than (not a substantially exact) replica of the envelope of the RF input signal, but is instead a reduced bandwidth slowly varying signal. Distortion caused by the bandwidth reduction is compensated by an adaptive pre-distortion of the RF input signal. Embodiments of the invention recognize and make use of the fact that ET amplifiers tolerate significant freedom in the choice of the supply waveform because the RF output signal is inherently an amplified version of the RF input signal, while accounting for the distortion introduced by the bandwidth reduction in an efficient manner.

In a preferred embodiment method and RF amplifier of the invention, an envelope signal of the RF amplifier is low pass-filtered and subtracted from itself to derive a difference signal, which is then rectified. This step insures that the desired RF output power can be attained by some appropriate pre-distortion of the RF input power. Simple low pass filtering does not guarantee meeting the condition that $V_{DD}(t) \geq V_{env}(t)$, where $V_{env}(t)$ (Eq. 1) is the envelope voltage required to achieve the required instantaneous output power. The rectified residue signal is filtered and then added back to the filtered envelope signal. The resulting signal, however can still violate (Eq. 1). To avoid this possibility, one approach is to iterate the procedure until the residue signal is acceptably small. After a few iterations, the reduced bandwidth $V_{DD}$ signal can be successfully generated without violating (Eq. 1). Another approach to avoid violating (Eq. 1) is to add a suitably chosen constant greater than one (for example, 2.5) times the filtered residue signal back to the filtered envelope signal, and to further add a predetermined constant (for example, 0.05) to the sum.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1 illustrates an ET amplifier where power to an RF power amplifier 10 is provided by a power supply modulator 12. The power supply modulator 12 delivers a power supply waveform, $V_{DD}(t)$. In previous work of some of the present inventors, the input of the power supply modulator 12 is generated by a digital signal processor (DSP) where de-troughing and de-cresting is also performed. See, D. F. Kimball, J. Jeong, C. Hsia, P. Draxler, S. Lanfranco, W. Nagy, K. Linthicum, L. E. Larson, and P. M. Asbeck, "High-Efficiency Envelope-Tracking W-CDMA base-station amplifier using GaN HFETs," IEEE Trans. Microw. Theory Tech., vol. 54, pp. 3848-3856, (November 2006). In preferred embodiments, the envelope supply modulator 12 has an architecture in accordance with that disclosed in U.S. Pat. No. 6,583,664. As mentioned above, the power supply signal $V_{DD}(t)$ does not need to be an exact replica of the envelope of original signal. The inset in FIG. 1 shows the power supply voltage $V_{DD}(t)$ is a slowly varying, reduced bandwidth signal compared to the envelope of the output signal of the RF power amplifier. With $V_{DD}(t)$ generated according to the invention and appropriate pre-distortion of the RF input in accordance with the invention of the RF power amplifier 10, the efficiency of RF power amplifier 10 can remain very high. With the invention $V_{DD}(t)$ is provided to ensure that $V_{DD}(t)$ voltage is sufficiently large to not cause clipping of the amplifier output and be delivered with sufficient accuracy such that the error it introduces can be compensated by adjustment of the RF input signal through a pre-distortion that is introduced. With the invention, the dynamic power supply waveform $V_{DD}(t)$ can be dramatically reduced in bandwidth and Peak-to-Average Power ratios over present commercial designs. The reduced bandwidth power supply signal $V_{DD}(t)$, introduces a distortion into the RF output but is compensated with appropriate pre-distortion of the RF input signal according to the invention. The bandwidth of the RF input signal is expanded but the expanded signal bandwidth can remain within the system limits established by DAC, ADC and filters in the DSP and up-conversion system.

Figures 2A, 2B:
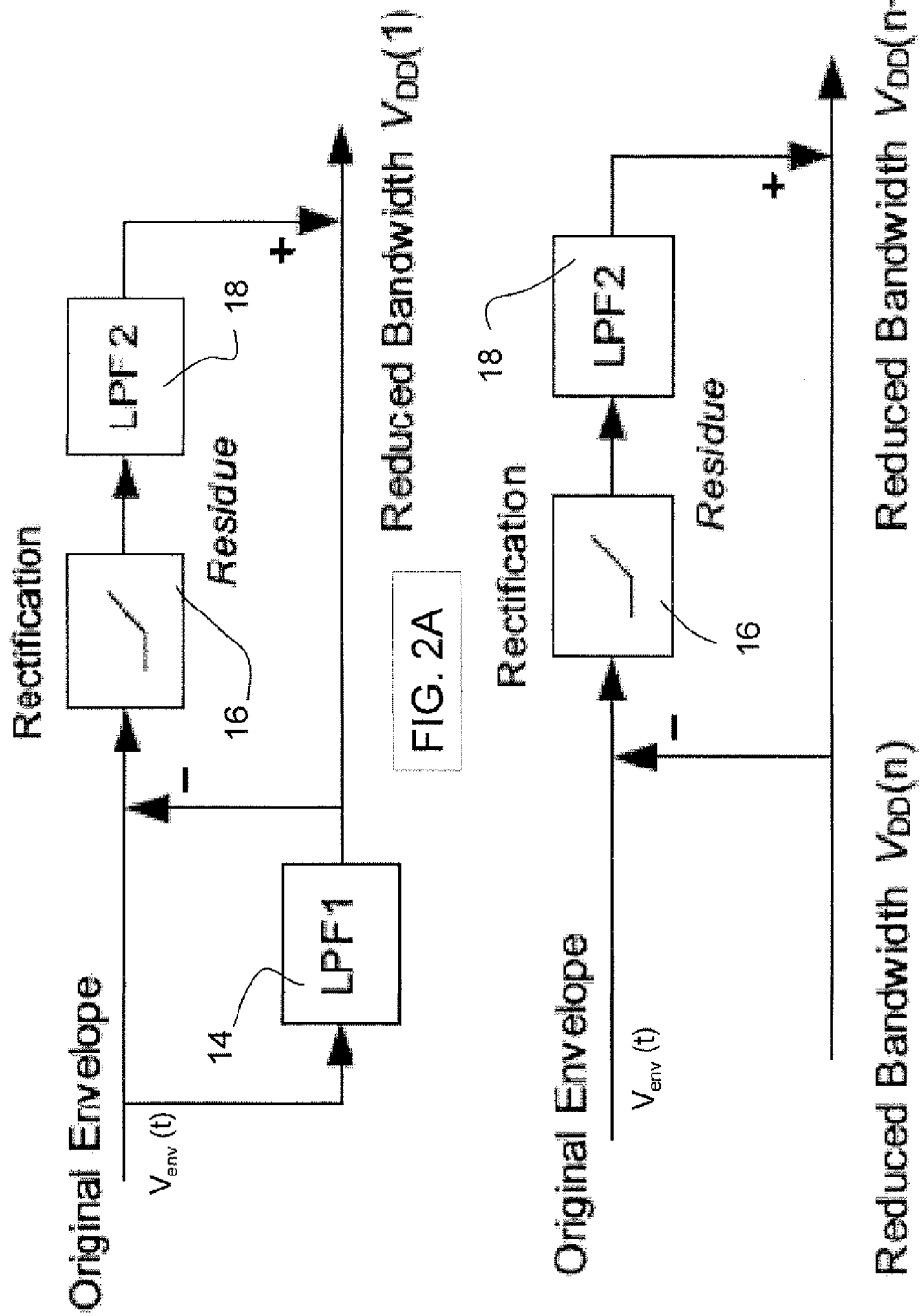
FIGS. 2A, 2B and 2C are schematic diagrams that respectively illustrate bandwidth reduction processes of preferred embodiment methods and systems of the invention.
Figure 2C:
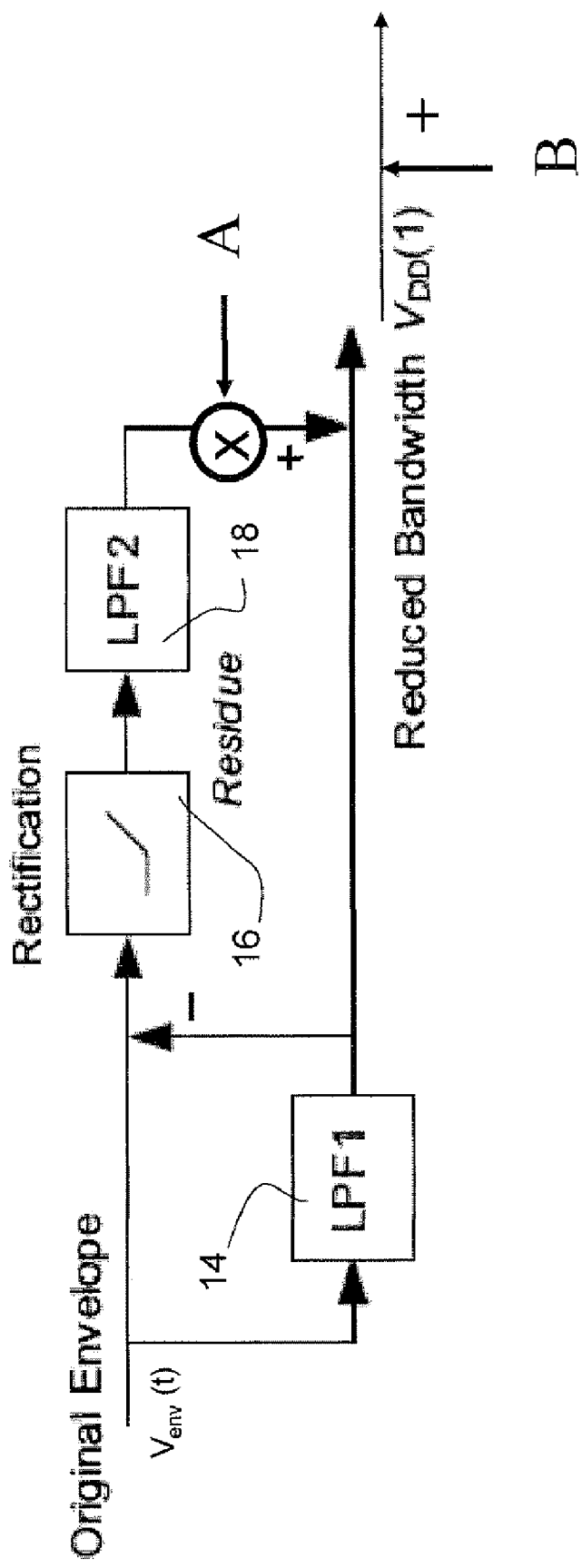

FIGS. 2A and 2B are schematic diagrams that respectively illustrate bandwidth reduction steps including initial low pass filtering of an envelope signal and iterative filtering to reduce a residue signal to a level that will not result in clipping of the output voltage and permits correction by pre-distortion. In FIG. 2A, the envelope signal is low pass filtered by a first low pass filter LPF1 14 and subtracted from itself to derive a difference signal, which is then rectified by a rectifier 16. Only positive values of the difference signal can lead to violations of condition (1) above. The rectified signal (labeled as residue) is filtered by a second low pass filter LPF2 18 and is then added back to the filtered envelope signal $V_{DD}$(1). In FIG. 2B, the reduced bandwidth signal $V_{DD}$(n), $V_{DD}$(n+1), $V_{DD}$(n+2) is iteratively subtracted from the original envelope signal until the residue signal is acceptably small. After a few iterations, the reduced bandwidth $V_{DD}$(n) signal can be successfully generated without violating the condition (1). Another approach to avoid violating (Eq. 1) is to add a suitably chosen constant greater than one (for example, 2.5) times the filtered residue signal back to the filtered envelope signal, and to further add a predetermined constant (for example, 0.05) to the sum. This is illustrated in FIG. 2C, wherein constants A and B are added to ensure that condition 1) is met. The factor A and constant B are selected in accordance with simulations of the waveform. While constants so selected may result in an insubstantial number of occurrences where condition 1) is not met, in practice the condition is met closely enough to lead to acceptable system performance. In general the factor A and constant B would be selected specifically for the signal waveform to be transmitted.

Figure 2D:
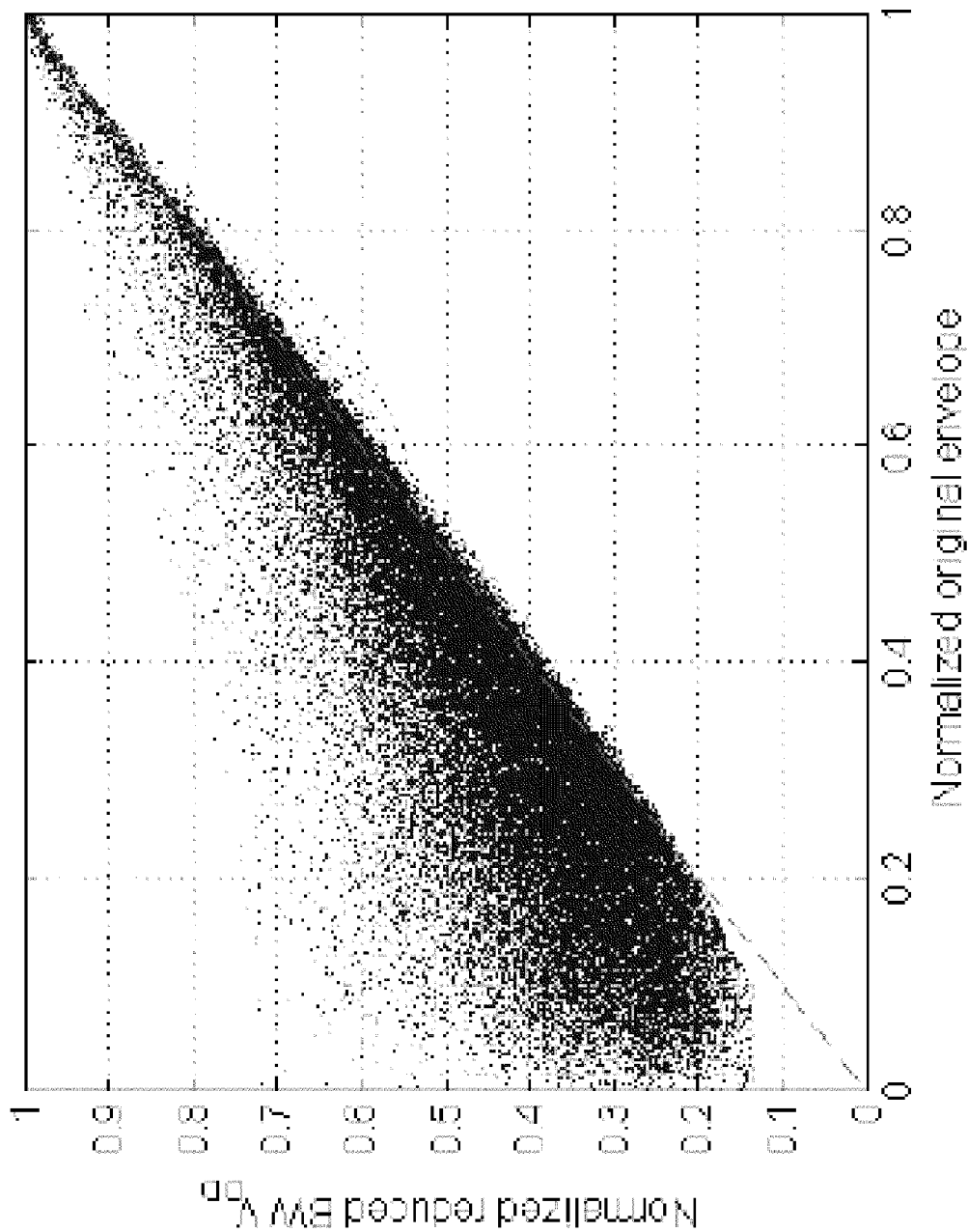
FIGS. 2D and 2E plot samples (taken at 107.52-MHz sampling frequency) of and example $V_{DD}(t)$ signal vs. Venv of an example 3.84-MHz single carrier WCDMA signal, with FIG. 2D illustrating a result after the initial bandwidth reduction process of FIG. 2A and FIG. 2E the result after the iterative bandwidth reduction process of FIG. 2B.
Figure 2E:
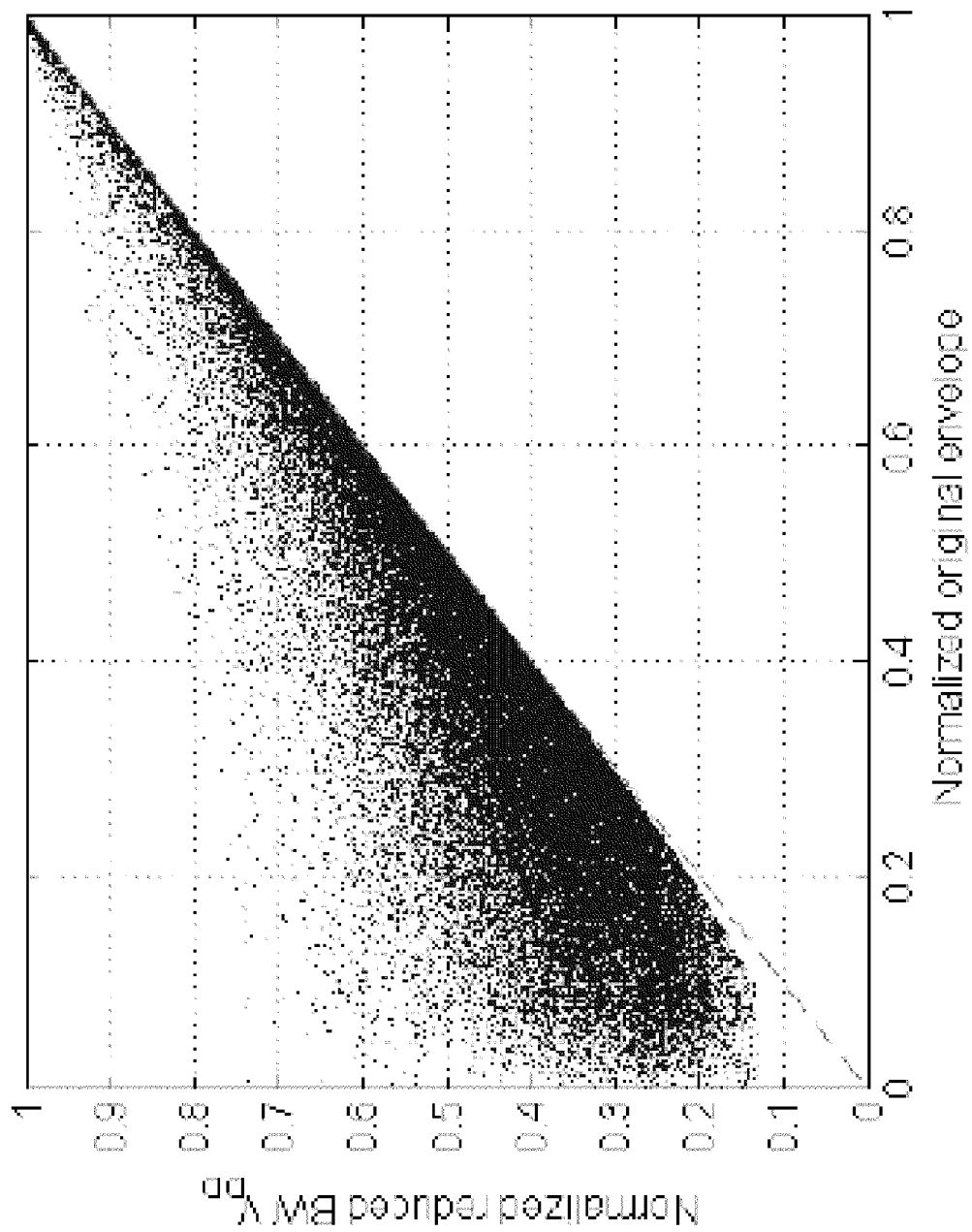
Figure 2F:
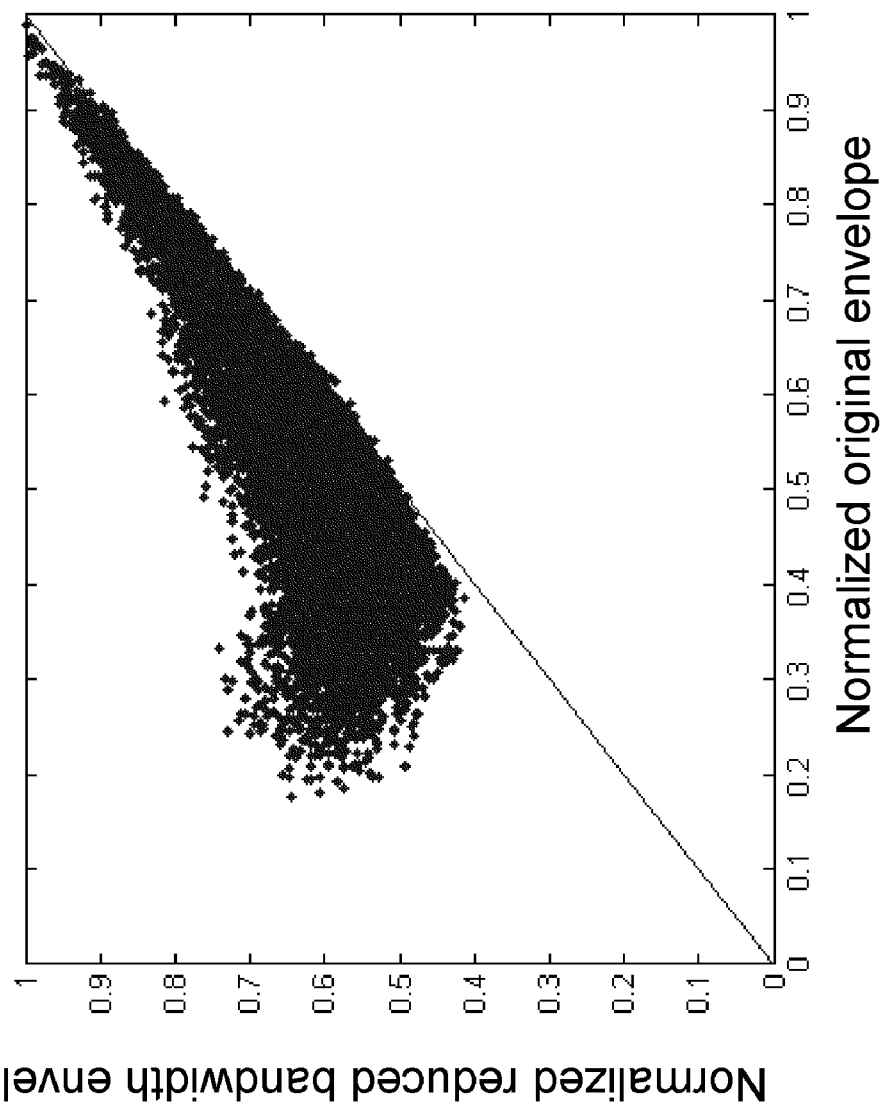
FIG. 2F is a similar plot that shows the result of the bandwidth reduction of FIG. 2C for a CDMA signal using a constants of A=2 and B=0.5.

FIGS. 2D and 2E plot samples (taken at 107.52-MHz sampling frequency) of the resulting $V_{DD}$(t) signal vs. Venv of an example 3.84-MHz single carrier WCDMA signal. The plots are a representative sampling of normalized $V_{DD}$(t) points for a given normalized desired envelope illustrating the large spread in $V_{DD}$(t) vs. x(t), meaning that there are multiple possible values input signal values for a particular $V_{DD}$(t) and vice versa. In this example, the low pass filter 14 in FIG. 2A for the envelope signal has a pass band frequency, fp1 of 1 MHz and a stopband frequency, fs1 of 4 MHz. The low pass filter LPF2 18 for the residue signal has pass band frequency, fp2 of 0.5 MHz and a stopband frequency, fs2 of 2 MHz. In FIG. 2D, data points below dashed line indicate that the condition (1) is still violated. However, in FIG. 2E, after a few iterations all data points are successfully placed above the dashed line, which indicates that condition (1) will be met. FIG. 2F is a similar plot that shows the result of the bandwidth reduction of FIG. 2C for a CDMA signal using a constants of A=2 and B=0.5. All data points indicate that condition (1) has been met.

Figure 2G:
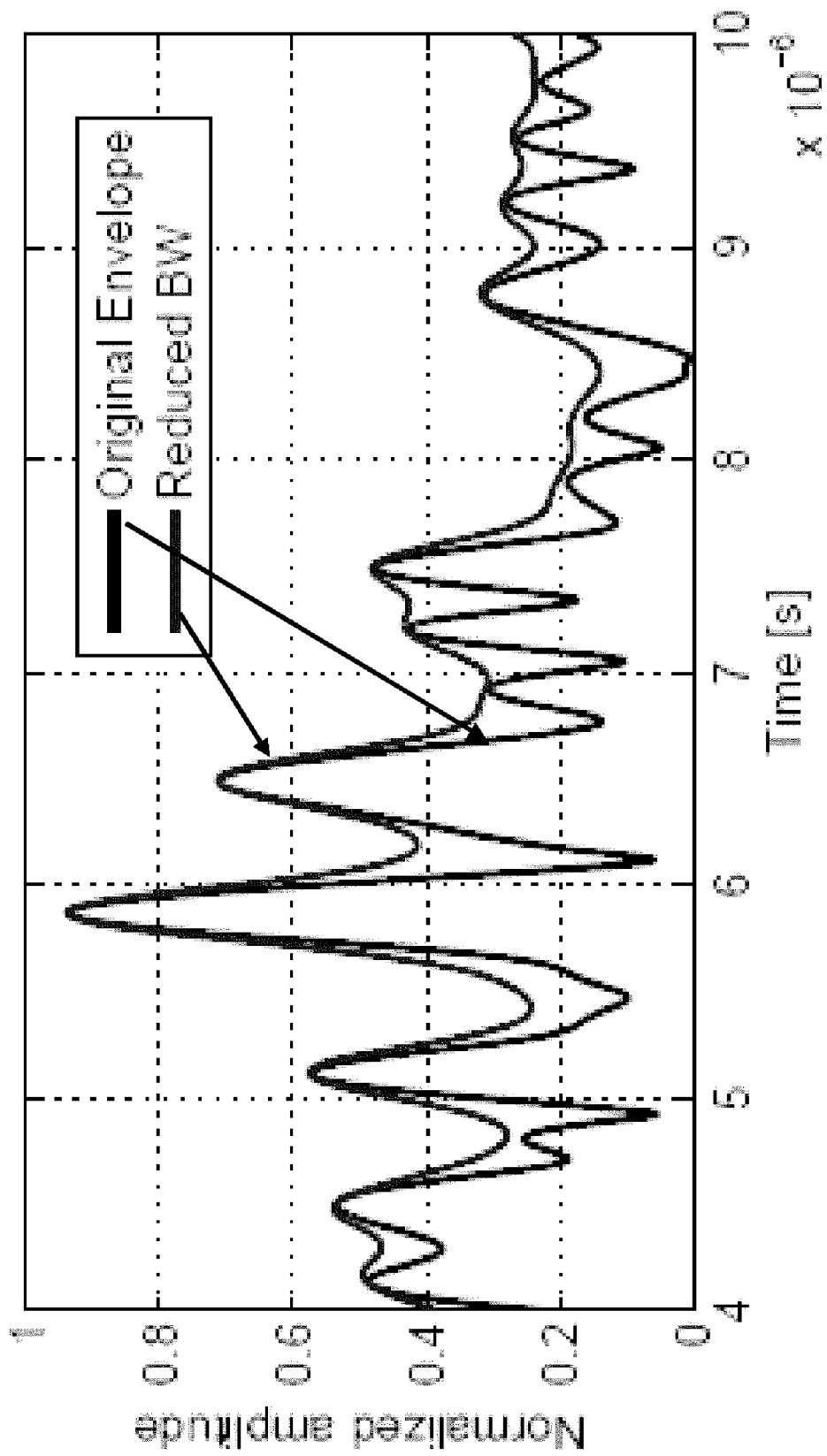
FIG. 2G shows time domain waveforms of the envelope signal of an example WCDMA signal with a PAPR of 7.8 dB and the reduced bandwidth signal (which has a PAPR of 6.2 dB)
Figure 2H:
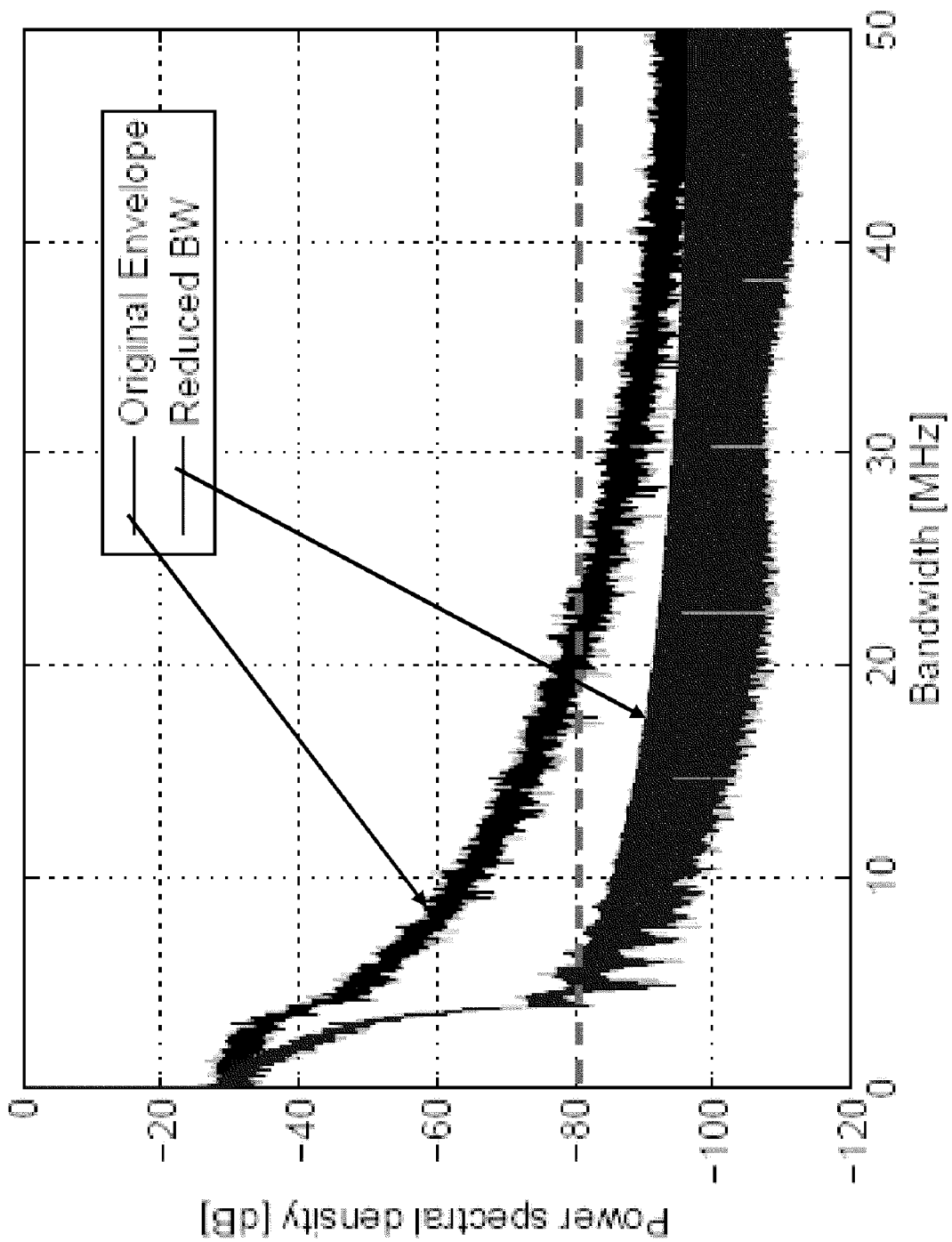
FIG. 2H plots the power spectral densities corresponding to FIG. 2E.

FIG. 2G shows the time domain waveforms of the envelope signal of an example WCDMA signal with a PAPR of 7.8 dB and the reduced bandwidth signal (which has a PAPR of 6.2 dB). The corresponding power spectral densities are plotted in FIG. 2H, where the reduction in bandwidth is apparent. In FIG. 2H the effective bandwidth is indicated by the dashed line as the frequency where the power spectral density falls below −80 dBc, whereas the bandwidth of the original envelope signal is approximately 20 MHz and the bandwidth is reduced to 5 MHz in the reduced bandwidth $V_{DD}$(t) signal. This bandwidth reduction introduces a unique linearization problem.

The pre-distorted value of the input amplitude, xp(t) in the RF input path of the PA must be chosen to provide a particular desired value of output x(t). However, the input-output relationship is strongly influenced by $V_{DD}$(t). With the reduced bandwidth signal, there are many values of $V_{DD}$(t) that can occur for a given x(t), as seen in the representative samples of FIGS. 2C and 2D. The invention provides pre-distortion, with a preferred embodiment system including being illustrated in FIG. 3.

Figure 3:
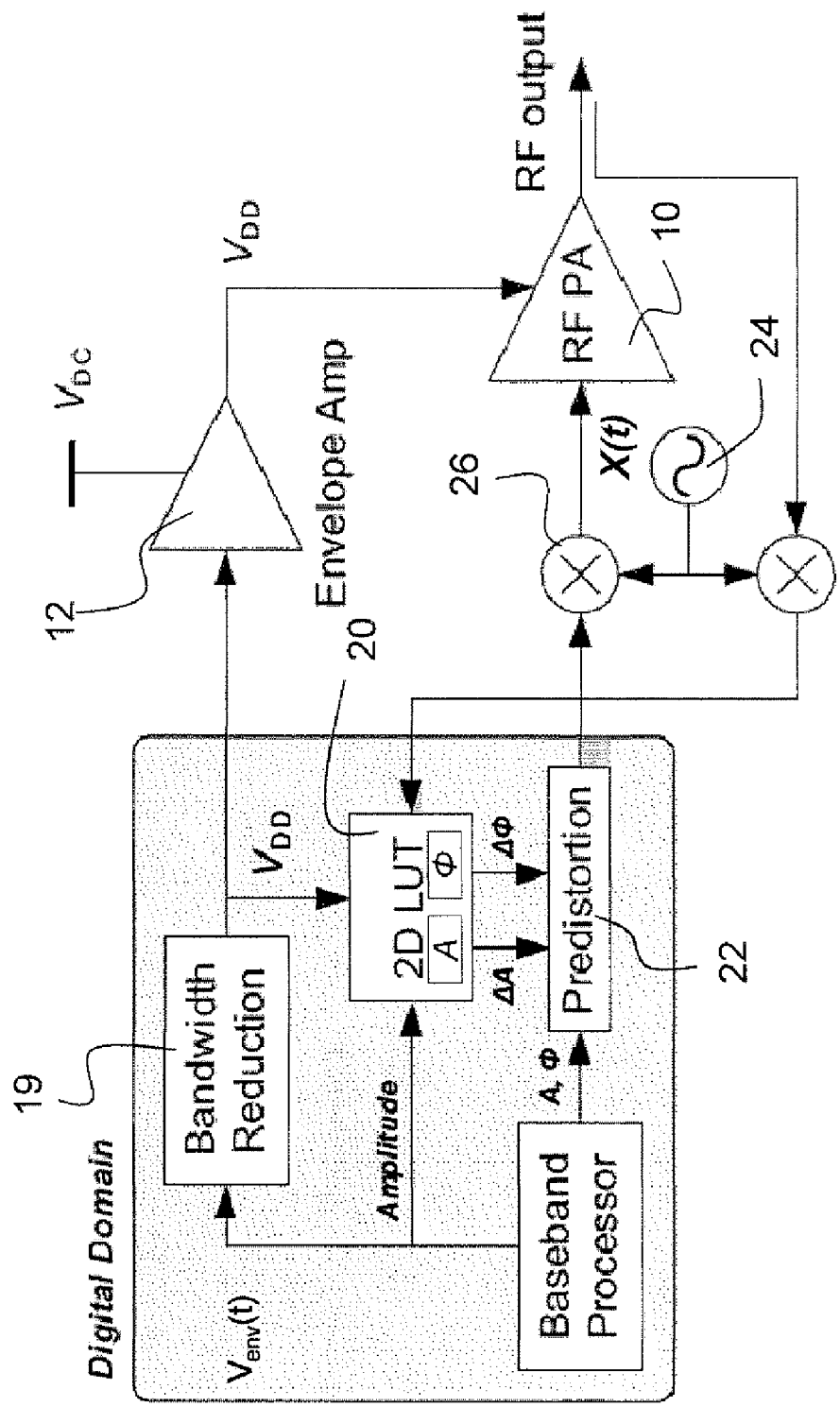
FIG. 3 is a schematic diagram of a preferred system having an envelope tracking amplifier having a reduced bandwidth envelope amplifier supply and digital adaptive pre-distortion of an RF input signal in accordance with a preferred embodiment of the invention.

FIG. 3 illustrates an envelope tracking amplifier system having a reduced bandwidth envelope amplifier supply and digital pre-distortion of an RF input signal in accordance with a preferred embodiment of the invention. For the sake of simplicity, standard components relating to the conversions performed between the analog and digital domains have been omitted. The bandwidth reduction 19 of FIGS. 2A and 2B is first conducted to produce the reduced bandwidth supply waveform, $V_{DD}$(t). Then, for each input signal value x(t), a two dimensional lookup tables (amplitude and phase LUTs) 20 indexed by both $V_{DD}$(t) and x(t) is used to find the appropriate distortion value xp(t) such that the output has the desired value given the corresponding value of $V_{DD}$(t). The amplitude and phase LUTs 20 are periodically updated by measuring the amplitude and phase of an output of the PA output. Measurement updates are iterated in order to provide entries into the LUT 20 needed to cover an appropriate range for the x(t) and $V_{DD}$(t) signals. The bandwidth reduction system 19 of FIGS. 2A, 2B provides an envelope power supply signal $V_{DD}(t) \geq V_{env}(t)$, where $V_{env}$(t) (Eq. 1) is the envelope voltage required to achieve the required instantaneous output power for the RF power amplifier 10. A baseband processor 21 provides the basic $V_{DD}$(t) signal to the bandwidth. The LUT 20 provides amplitude and phase signals to permit a digital domain pre-distortion generator 22 that mixes an appropriate pre-distortion into an input RF signal 24 at a mixer 26.

The measured amplitude and phase of the PA 10 output are stored in the LUTs 20 according to the corresponding $V_{DD}$(t) and x(t) indices. For adaptation to slowly varying environments, a moving average of the measurements is taken for each entry. Since the PA 10 output is measured at a specific pair of $V_{DD}$(t) and x(t), there can be unvisited entries in LUTs, which are filled with zeros. Output amplitude can be significantly scattered with respect to a given $V_{DD}$(t) and x(t) which can result in errors when producing the normalized pre-distorted input, xp. Several factors can cause this scattering; measurement error, the limited bandwidth of the supply modulator, the memory effects in the RF PA, etc. In preferred embodiment of the invention, this scattering is corrected via a polynomial model given by $$y = f(x, v) = \sum_{n=1}^{N} \sum_{m=0}^{M} c_{nm} x^n v^m \quad (2)$$

where N is the order of nonlinearity for x and M is the order of nonlinearity for v. The coefficients, $c_{nm}$, are found by a least mean square (LMS) algorithm and then the entries in the amplitude LUT are replaced with the curve fitted value calculated from equation (2).

The polynomial curve fitting works well for the region where the number of the visited entries in the LUTs are high. However, in order to calculate the pre-distorted input signal, an estimation of the unvisited entries is necessary for some cases, which is addressed further below. In general, the condition given by $$\frac{\partial y}{\partial x} = \sum_{n=1}^{N} \sum_{m=0}^{M} n c_{nm} x^{n-1} v^m \geq 0 \quad (3)$$

is met for most RF amplifiers. In other words, y is a monotonic increasing function of x for all v, which is physically reasonable. This property can be used to estimate the unvisited entries in the amplitude LUT. For accuracy, this estimation is replaced with actual measurements once the entries are visited by a pair of $V_{DD}(t)$ and x(t). In FIG. 3, to correct the distortion caused by the reduced bandwidth $V_{DD}(t)$ signal, the RF input signal 24 is pre-distorted, i.e., it is backed off or increased. In the case where the pre-distortion backs off the input signal, the efficiency of RF amplifier degrades since the amplifier is less compressed. When the pre-distortion increases the RF input signal 24, the efficiency of RF amplifier improves since the amplifier is more compressed. For the pre-distortion, an effective estimation of LUT entries is necessary. In preferred embodiments, the pre-distortion is performed as follows for a given value of x(t) and $V_{DD}(t)$:

1) Select the two closest $V_{DD}(t)$ indices, $iv_1$, $iv_2$ from the LUT.
2) For $iv_1$, find $xp_1$ by interpolating valid entries in the amplitude LUT.
3) For $iv_2$, find $xp_2$ by interpolating valid entries in the amplitude LUT.
4) Find xp by interpolating $xp_1$ and $xp_2$.
5) Find the pre-distorted input phase by interpolating the entries in the phase LUT.

Experimental Data

The bandwidth reduction in accordance with FIGS. 2A, 2B and 3 has been tested using an envelope tracking test bench. The dynamic power supply voltage generator has been described in D. F. Kimball, J. Jeong, C. Hsia, P. Draxler, S. Lanfranco, W. Nagy, K. Linthicum, L. E. Larson, and P. M. Asbeck, "High-efficiency envelope-tracking W-CDMA basestation amplifier using GaN HFETs," *IEEE Trans. Microw. Theory Tech.*, vol. 54, pp. 3848-3856, November 2006 and the RF stage based on a GaAs HV-HBT from Triquint has been described in D. Kimball, M. Kwak, P. Draxler, J. Jeong, C. Hsia, C. Steinbeiser, T. Landon, O. Krutko, L. Larson, and P. Asbeck, "High efficiency WCDMA envelope tracking basestation amplifier implemented with GaAs HVHBTs," in Proc. IEEE Compound Semicond. Integr. Circuit Symp., Monterey, Calif., October 2008. Power supply waveforms and baseband signals for the RF input were generated in a DSP system with a clock frequency of 107.52 MHz. The RF upconversion path used a digital IF frequency of 26.88 MHz. The pre-distortion bandwidth was limited by a band pass filter with a bandwidth of approximately 40 MHz. A 3.84-MHz single carrier WCDMA signal with the reduced bandwidth $V_{DD}(t)$ was used at the 2.14 GHz frequency band throughout the experiments.

AM-AM and AM-PM distortions caused by the reduced bandwidth $V_{DD}(t)$ signal and the nonlinearity of the RF PA were readily apparent from plots of the resulting signal. "Fuzziness" in such plots is partly due to the memory effects of the ET PA itself but mostly due to the reduced bandwidth $V_{DD}(t)$ signal (with only a minor contribution from noise). After the linearization provided by the preferred embodiments of FIGS. 2A, 2B and 3, the AM-AM and AM-PM distortions, including the "fuzziness", were successfully corrected. The LUT updating was iterated 14 times in order to provide sufficient LUT coverage to achieve a normalized RMS error of 3.98%.

The effectiveness of the linearization method was also apparent from the measured output spectrum after pre-distortion, where adjacent channel leakage ratios (ACLRs) were measured to be as low as −41.36 and −47.5 dB at 5 and 10 MHz offsets, respectively. The required pre-distortion bandwidth was shown to be not dramatically wider than that of conventional envelope tracking PAs.

Measured output signals showed some distortions when the target signal rapidly changes. This distortion was due to the limited bandwidth of the ET test bench which has a band pass filter with a bandwidth of approximately 40 MHz. Table I summarizes the measured performance of the ET amplifier with and without the reduced bandwidth $V_{DD}(t)$ signal, both after pre-distortion. As expected, the efficiency of the $V_{DD}(t)$ amplifier has been improved at the expense of the degraded efficiency of the RF PA. The gain has increased because the pre-distortion has happened in such a way that the PA is less compressed. The overall power added efficiency (PAE) has been slightly degraded from the results for the conventional ET amplifier. It should be noted that the power supply modulator used in this experiment has adequate bandwidth to generate the WCDMA envelope used here with high efficiency. It is expected that significant improvements in overall system efficiency will appear for signals for which the envelope bandwidth is beyond the reach of available efficient supply modulators.

TABLE I

SUMMARIZED PERFORMANCE OF ET AMPLIFIER WITH AND WITHOUT REDUCED BANDWIDTH SUPPLY WAVEFORMS USING GAAS HVHBT PA.

|  | ET after DPD | Reduced BW ET |
|---|---|---|
| Envelope BW [MHz] | 20 | 5 |
| $V_{DD}$ PAPR [dB] | 7.8 | 6.2 |
| Pin [W] | 2.26 | 1.34 |
| Pout [W] | 25.75 | 25.43 |
| Gain [dB] | 10.56 | 12.79 |
| $P_{DC}$ [W] | 44.40 | 48.14 |
| PAE [%] | 52.91 | 50.04 |
| η ($V_{DD}$) [%] | 66.19 | 68.53 |
| η (RF PA) [%] | 87.61 | 77.09 |
| Normalized RMS error [%] | 2.72 | 3.98 |
| ACLR1 [dBc] | −46.40 | −41.36 |
| ACLR2 [dBc] | −50.37 | −47.50 |

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method of generating a reduced bandwidth envelope signal $V_{DD}(t)$ for a power supply modulator of an RF amplifier, the method comprising:
   low pass filtering an envelope signal $V_{env}(t)$ of an RF amplifier input;
   subtracting the filtered envelope signal from the envelope signal to obtain a difference signal;
   rectifying the difference signal to produce a residue signal;
   low pass filtering the residue signal;
   adding the filtered residue signal back into the filtered envelope signal;
   repeating said rectifying, said low pass filtering the residue signal and said adding until a condition of $V_{DD}(t) \geq V_{env}(t)$ is met.

2. The method of claim 1, further comprising a step of pre-distorting an input signal x(t) of the RF amplifier input.

3. The method of claim 2, wherein said step of pre-distorting comprises, for each input signal value x(t) using a look-up table indexed by both the input signal x(t) and the reduced bandwidth envelope signal $V_{DD}(t)$ to provide a value that indicates the phase and amplitude of pre-distortion to be applied.

4. The method of claim 3, wherein the look-up table includes values relating to the RF amplifier output that are corrected via a polynomial model given by:

$$y = f(x, v) = \sum_{n=1}^{N} \sum_{m=0}^{M} c_{nm} x^n v^m \qquad (2)$$

where N is the order of nonlinearity for x and M is the order of nonlinearity for v, the coefficients, $c_{nm}$ are found by a least mean square algorithm and amplitude values in the look up table are replaced with a curve fitted value calculated from equation (2).

5. The method of claim 4, wherein the look-up table is updated during operation of the RF amplifier and unvisited entries in the look-up table are provided estimates by assuming that an amplitude RF amplifier and unvisited entries in the look-up table are provided estimates by assuming that an amplitude y is a monotonic increasing function of x.

6. The method of claim 5, wherein the look-up table comprises amplitude and phase look up tables, and estimates for unvisited entries are determined for a given value of x(t) and $V_{DD}(t)$ by selecting two closest $V_{DD}(t)$ indices, $iv_1$, $iv_2$ to the given value from the amplitude look up table;

for $iv_1$, find a pre-distortion value $xp_1$ by interpolating valid entries in the amplitude look up table;

for $iv_2$, find another pre-distortion value $xp_2$ by interpolating valid entries in the amplitude look up table;

find a final pre-distortion amplitude xp by interpolating $xp_1$ and $xp_2$;

find pre-distorted input phase by interpolating the corresponding entries in the phase look up table.

7. The method of claim 2, wherein said pre-distorting comprises:

for each input signal value x(t), referring to a two dimensional look-up table indexed by both $V_{DD}(t)$ and x(t) to find an appropriate pre-distortion value of xp(t) such that the RF amplifier output has a predetermined value corresponding to the value of $V_{DD}(t)$;

determining a pre-distortion of the RF amplifier input signal from values associated with the values found in the step of referring to the two dimensional look-up table.

8. A method of generating a reduced bandwidth envelope signal $V_{DD}(t)$ for a power supply modulator of an RF amplifier, the method comprising:

low pass filtering an envelope signal $V_{env}(t)$ of an RF amplifier input;

subtracting the filtered envelope signal from the envelope signal to obtain a difference signal;

rectifying the difference signal to produce a residue signal;

low pass filtering the residue signal;

multiplying the filtered residue signal by a first constant that is greater than one and then adding it back into the filtered envelope signal;

adding a second constant into the filtered envelope signal so that the condition $V_{DD}(t) \geq V_{env}(t)$ is met.

* * * * *

UNITED STATES PATENT AND TRADEMARK OFFICE
CERTIFICATE OF CORRECTION

PATENT NO. : 8,159,295 B2
APPLICATION NO. : 12/785090
DATED : April 17, 2012
INVENTOR(S) : Asbeck et al.

It is certified that error appears in the above-identified patent and that said Letters Patent is hereby corrected as shown below:

In the Specification:

| | |
|---|---|
| Col. 1, line 54 | Please delete "look up" and insert --look-up-- therefor. |
| Col, 2, line 30 | Please delete "Venv" and insert --$V_{env}$-- therefor. |
| Col. 5, line 28 | Please delete "Venv" and insert --$V_{env}$-- therefor. |
| Col. 6, line 10 | Please delete "lookup tables" and insert --look-up table-- therefor. |

In the Claims:

| | |
|---|---|
| Col. 9, line 16<br>Claim 4 | Please delete "look up" and insert --look-up-- therefor. |
| Col. 9, line 25<br>Claim 6 | Please delete "look up" and insert --look-up-- therefor. |
| Col. 9, line 25<br>Claim 6 | Please delete "look up" and insert --look-up-- therefor. |
| Col. 9, line 29<br>Claim 6 | Please delete "look up" and insert --look-up-- therefor. |
| Col. 9, line 31<br>Claim 6 | Please delete "look up" and insert --look-up-- therefor. |
| Col. 10, line 2<br>Claim 6 | Please delete "look up" and insert --look-up-- therefor. |
| Col, 10, line 6<br>Claim 6 | Please delete "look up" and insert --look-up-- therefor. |

Signed and Sealed this
Thirtieth Day of July, 2013

Teresa Stanek Rea
*Acting Director of the United States Patent and Trademark Office*